(12) United States Patent
Tsai et al.

(10) Patent No.: US 9,524,911 B1
(45) Date of Patent: Dec. 20, 2016

(54) METHOD FOR CREATING SELF-ALIGNED SDB FOR MINIMUM GATE-JUNCTION PITCH AND EPITAXY FORMATION IN A FIN-TYPE IC DEVICE

(71) Applicant: GLOBALFOUNDRIES Inc., Grand Cayman (KY)

(72) Inventors: Hao-Cheng Tsai, Clifton Park, NY (US); Yong Meng Lee, Mechanicville, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/858,412

(22) Filed: Sep. 18, 2015

(51) Int. Cl.
| H01L 21/8234 | (2006.01) |
| H01L 29/66 | (2006.01) |
| H01L 29/78 | (2006.01) |
| H01L 29/423 | (2006.01) |
| H01L 29/08 | (2006.01) |
| H01L 29/40 | (2006.01) |
| H01L 27/088 | (2006.01) |
| H01L 21/762 | (2006.01) |

(52) U.S. Cl.
CPC . H01L 21/823481 (2013.01); H01L 21/76232 (2013.01); H01L 21/823431 (2013.01); H01L 27/0886 (2013.01); H01L 29/0847 (2013.01); H01L 29/401 (2013.01); H01L 29/42356 (2013.01); H01L 29/66795 (2013.01); H01L 29/785 (2013.01)

(58) Field of Classification Search
CPC .............. H01L 21/823481; H01L 21/76232; H01L 21/823431; H01L 27/0886; H01L 29/0847; H01L 29/401; H01L 29/42356; H01L 29/66795; H01L 29/785
See application file for complete search history.

(56) References Cited

U.S. PATENT DOCUMENTS

| 6,723,615 B2 * | 4/2004 | Shimizu ............ H01L 21/76897 257/506 |
| 8,853,035 B2 | 10/2014 | Yu et al. |
| 8,916,460 B1 | 12/2014 | Kwon et al. |
| 9,123,773 B1 | 9/2015 | Shen et al. |
| 2014/0117454 A1 | 5/2014 | Liu et al. |

* cited by examiner

Primary Examiner — Julio J Maldonado
Assistant Examiner — Farun Lu
(74) Attorney, Agent, or Firm — Ditthavong & Steiner, P.C.

(57) ABSTRACT

Methods for creating self-aligned FINFET SDBs for minimum gate junction pitch and epitaxy formation. Embodiments include forming separated openings in a hard mask on upper surfaces of Si fins; forming cavities in the fins, each of the cavities having a concave shape and a width extending under the hard mask on each side of the cavity; forming trenches in the fins, the trenches having an upper width substantially equal to a width of the openings and less than the width of a cavity; removing the hard mask; filling the trenches and the cavities with oxide, forming STI regions; forming an oxide mask layer on the upper surfaces of the fins and the STI regions; removing upper portions of the oxide in sections between the STI regions; and removing remaining portions of the oxide mask revealing the fins and upper surfaces of the STI regions.

16 Claims, 16 Drawing Sheets

BACKGROUND

BACKGROUND

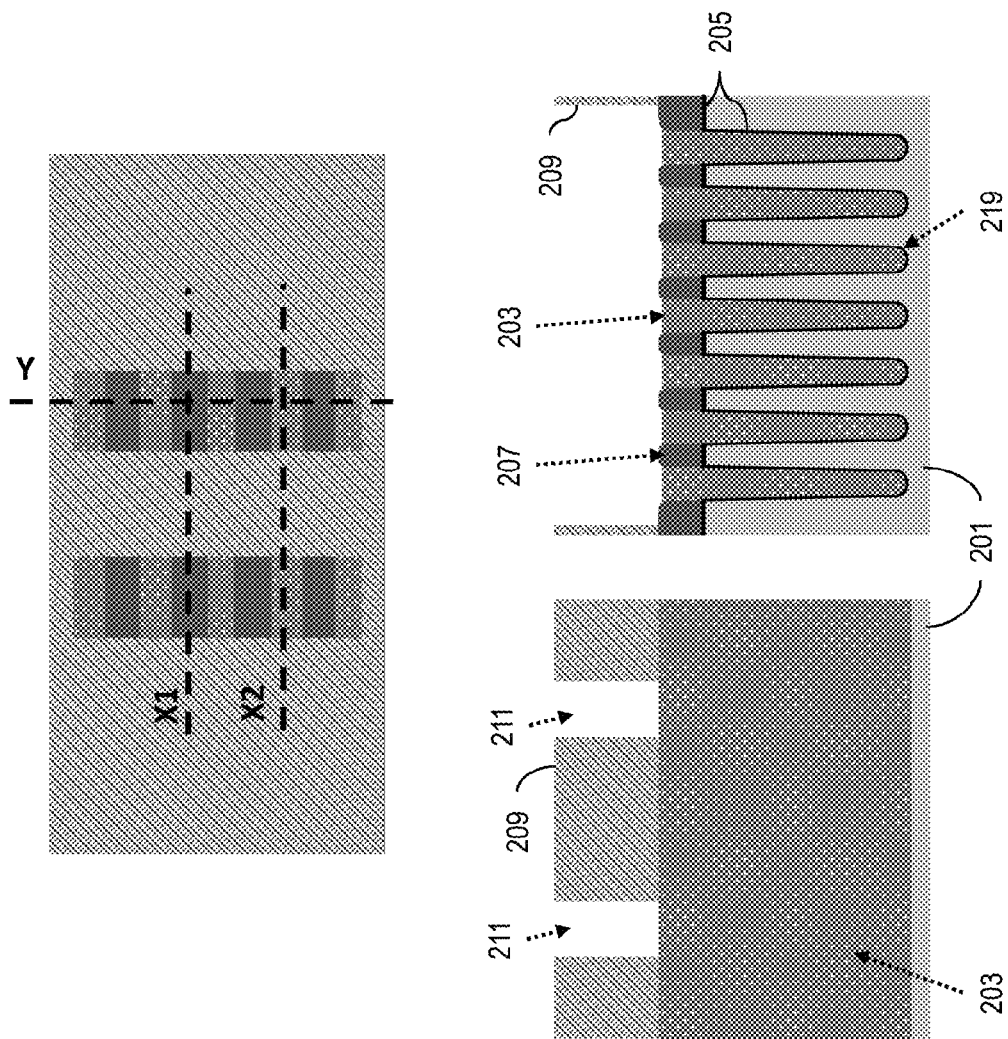

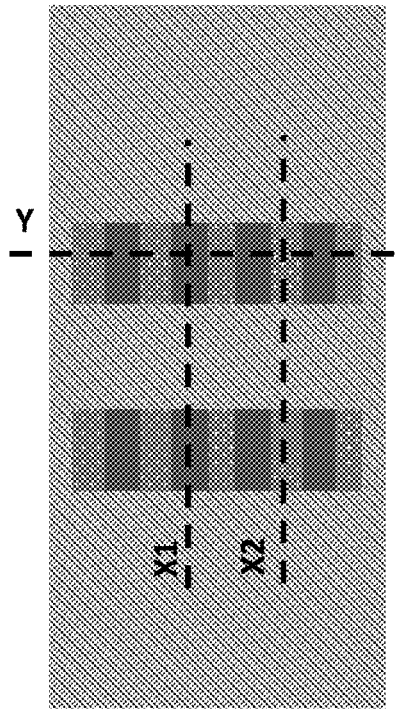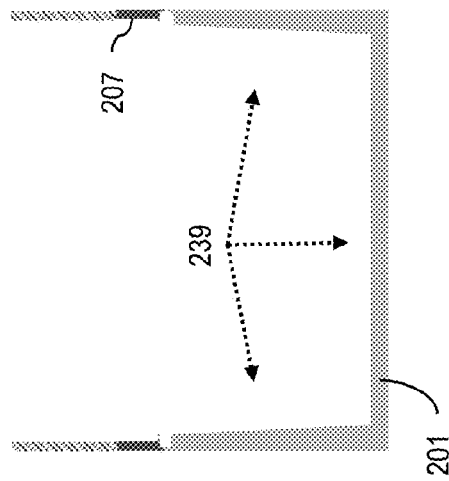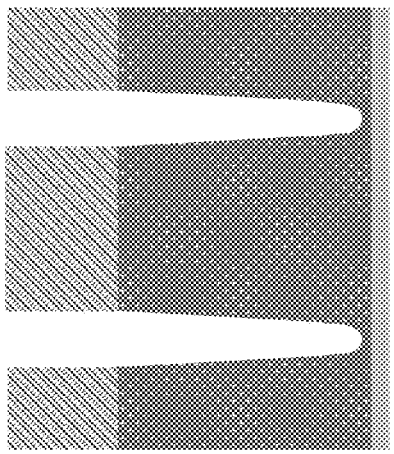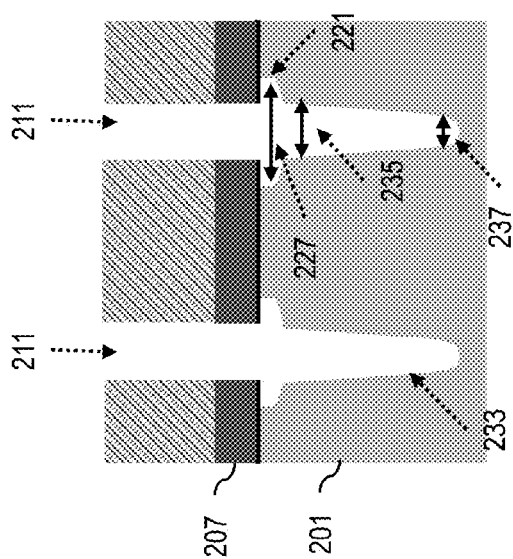
FIG. 2S
FIG. 2R
FIG. 2Q

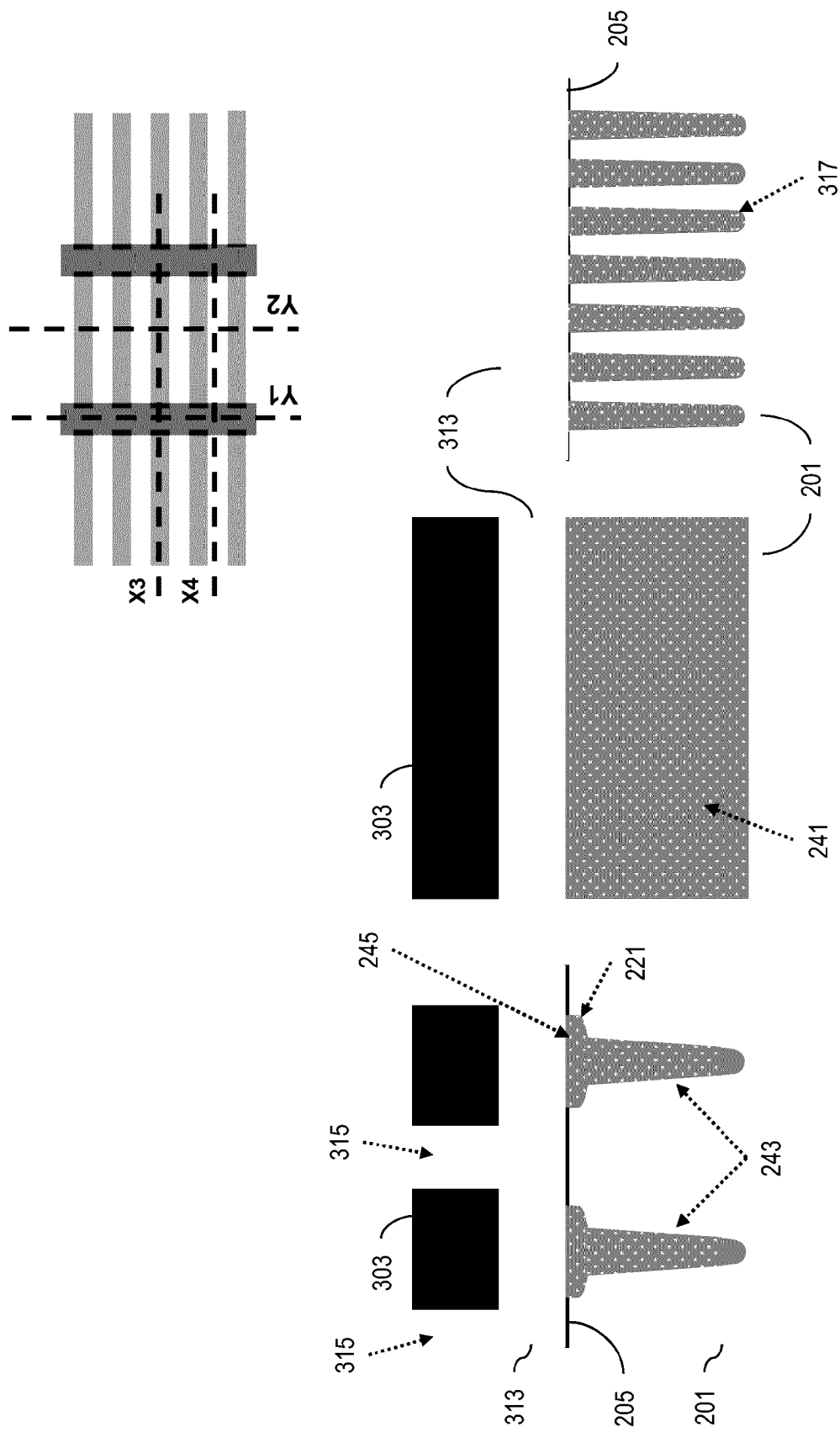

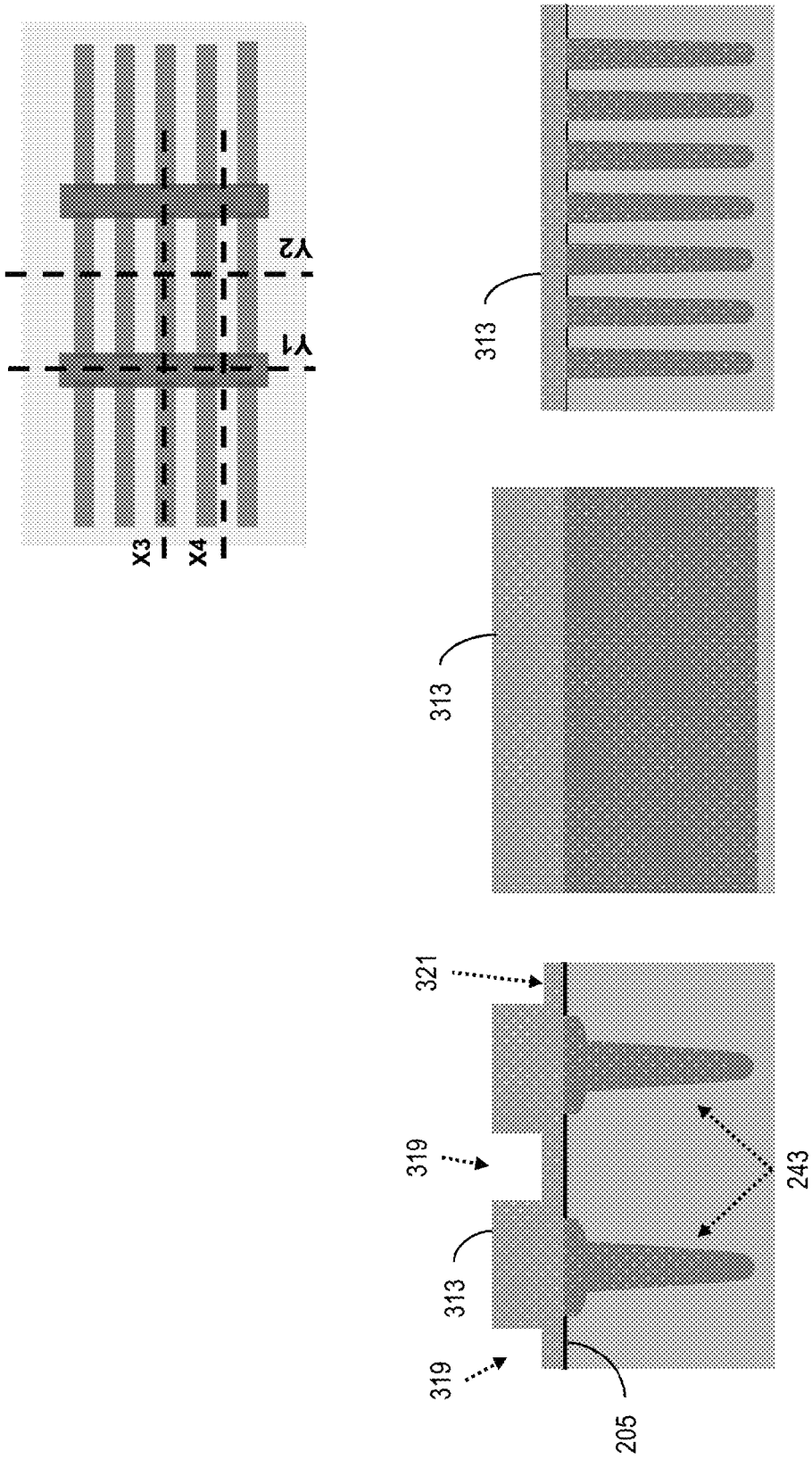

METHOD FOR CREATING SELF-ALIGNED SDB FOR MINIMUM GATE-JUNCTION PITCH AND EPITAXY FORMATION IN A FIN-TYPE IC DEVICE

TECHNICAL FIELD

The present disclosure relates generally to designing and fabricating integrated circuit (IC) devices. The present disclosure is applicable to design and fabrication processes associated with self-aligned single diffusion break (SDB) structures in fin-type field-effect-transistor (FINFET) IC devices, particularly for 10 nanometer (nm) technology nodes and beyond.

BACKGROUND

Generally, various advanced processes may be employed in design and fabrication of IC devices, particularly to aid with accurate integration of advanced technology components/structures having reduced geometries for higher IC devices. In scaling of FINFET devices, smaller fin pitch and shallow-trench-isolation (STI) regions/structures may be utilized. Conventional FINFET STI regions may result in poor epi junction growth for recessed source/drain (S/D) regions, which may be due to poor epitaxial material growth since the surrounding environment or sidewalls are formed of oxide. Recent improvements in STI structures (e.g., with an extra masking step) may allow implementation of a "mushroom-top" STI structure with one STI in between adjacent FINFET portions (i.e., an SDB). In this approach, the S/D regions, after S/D recess etching, may still preserve some "Si-seeding" on the sidewall (near the STI structure) for better S/D epi formation. However, the "mushroom-top" of the STI structure is sensitive to alignment errors (e.g., overlay+/−6 nm) and difficult to scale to smaller technology nodes (e.g., 10 nm, 7 nm, etc.) causing transistor performance variations (related to the epi volume variations at S/D).

FIGS. 1A and 1B illustrate example FINFET IC devices. FIG. 1A illustrates an example FINFET IC device that includes Si fin 101, gate electrodes 103 and 105 for two FINFETs, S/D regions 107/109, STI region 111, and a gate electrode 113 (e.g., dummy gate) on the STI region. As illustrated, there is poor growth in portions 115/117 of the epitaxially grown material in the S/D regions 107/109, as the surrounding environment is oxide for epitaxy growth. Also, there is poor isolation between the S/D junctions and the gate 113. Adverting to FIG. 1B, another example FINFET IC device includes fins 119 and 121 formed from a semiconductor substrate 101, a non-recessed STI region 123 disposed between the fins 119 and 121, a dummy gate 125 disposed on the non-recessed STI region 123, and active gates 127 and 129. The process utilized in forming the S/D regions between STI 123 and each of gates 127 and 129 is sensitive to alignment errors as the total amount of epi growth at S/D is related to the alignment, impacting the stress level at S/D and device performance; thus, additional layout area of S/D is needed. Other similar methods for FINFET IC devices face similar issues and challenges in the semiconductor industry.

A need therefore exists for a methodology for creating self-aligned FINFET SDBs for minimum gate junction pitch and improved epitaxy formation and the resulting device.

SUMMARY

An aspect of the present disclosure is a method for creating dish-shaped self-aligned FINFET SDBs for minimum gate junction pitch and improved epitaxy formation.

Another aspect of the present disclosure is an IC device including dish-shaped self-aligned FINFET SDBs for minimum gate junction pitch and improved epitaxy formation.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming separated openings in a hard mask layer on upper surfaces of Si fins; forming cavities in the Si fins through the openings, each of the cavities having a concave shape and a width extending on under the hard mask layer on each side of the cavity; forming trenches in the Si fins through the openings and the cavities, each of the trenches having an upper width substantially equal to a width of the openings and less than the width of a cavity; removing the hard mask layer; filling the trenches and the cavities with an oxide layer, forming STI regions; forming an oxide mask layer on the upper surface of the Si fins and upper surfaces of the STI regions; removing upper portions of the oxide mask layer in sections between the STI regions; and removing remaining portions of the oxide mask layer revealing the Si fins and upper surfaces of the STI regions.

Another aspect of the method includes forming the cavities by an isotropic etching process. One aspect of the method includes forming the trenches by an anisotropic etching process. In one aspect of the method, the STI regions include self-aligned and concave shaped upper portions.

A further aspect of the method includes forming a pair of S/D regions in the Si fin in between adjacent STI regions, wherein upper surfaces of the S/D regions adjacent to the STI regions are lower than the concave shaped upper portions of the STI regions.

In one aspect of the method, forming the S/D regions includes forming a gate electrode centered between a pair of adjacent STI regions; forming a cavity in the Si fin on opposite sides of the gate electrode; depositing a Si seed layer on a sidewall of the cavity adjacent to the concave shaped upper portions; and epitaxially growing S/D materials in the cavity.

In a further aspect of the method, the STI regions extend deeper than the S/D regions. An additional aspect of the method includes forming the hard mask layer of an amorphous carbon, an organic dielectric, or a silicon nitride material.

One aspect of the method includes forming the separated openings in the hard mask through a fin-cut lithography mask. A further aspect of the method includes removing the upper portions of the oxide mask layer through a reverse fin-cut lithography mask.

Another aspect of the present disclosure includes a device including: STI regions of oxide in a Si fin separating portions of the Si fin; and each of the STI regions having an upper portion wider than remaining portion of the STI region, wherein an upper surface of the upper portion is concave shaped.

One aspect of the device includes S/D regions in the Si fin in between adjacent STI regions, wherein upper surfaces of the S/D regions adjacent to the STI regions are lower than the concave shaped upper portions of the STI regions.

A further aspect of the device includes a gate electrode between adjacent STI regions, wherein the S/D regions include cavities in the Si fin on opposite sides of the gate electrodes; a Si seed layer on a sidewall of each cavity adjacent to the concave shaped upper portions; and epitaxially grown S/D materials in each cavity. In one aspect of the device, the STI regions extend deeper than the S/D regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A through 3K schematically illustrate a process flow for a reverse fin-cut process in creating self-aligned FINFET SDBs for minimum gate junction pitch and epitaxy formation, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of poor epi-junction growth attendant upon forming S/D regions in cavities adjacent conventional SDBs. The present disclosure addresses and solves such problems, for instance, by, inter alia, forming STI regions having dish-shaped upper surfaces for self-aligned SDB structures.

Figure 1A:
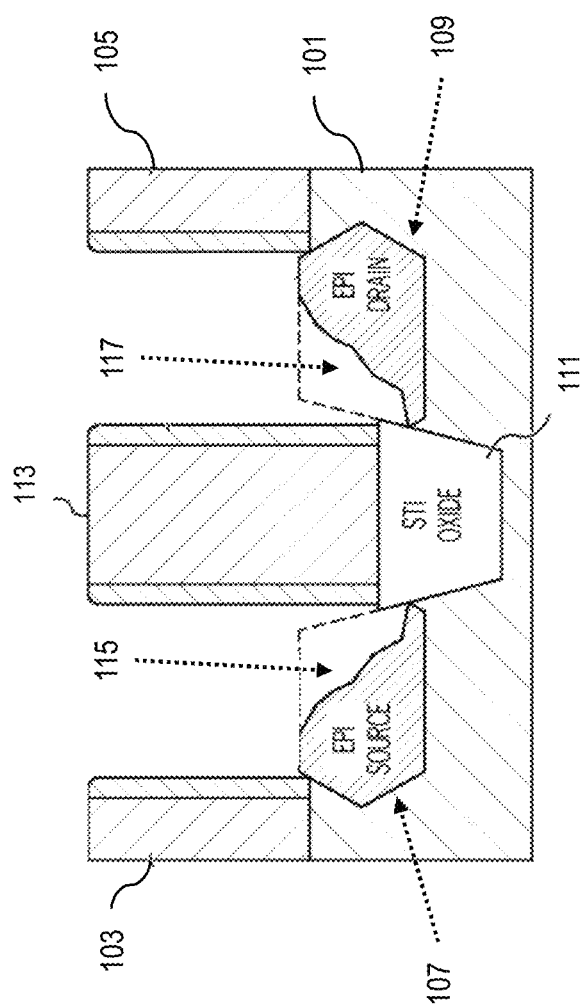
FIGS. 1A and 1B are cross sectional diagrams of example FINFET IC devices.
Figure 1B:
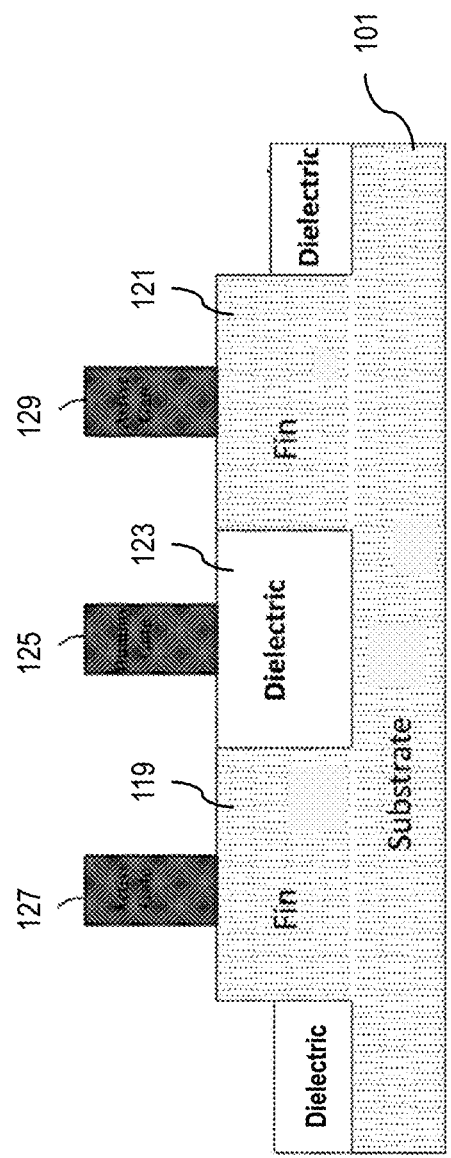
Figure 2A:
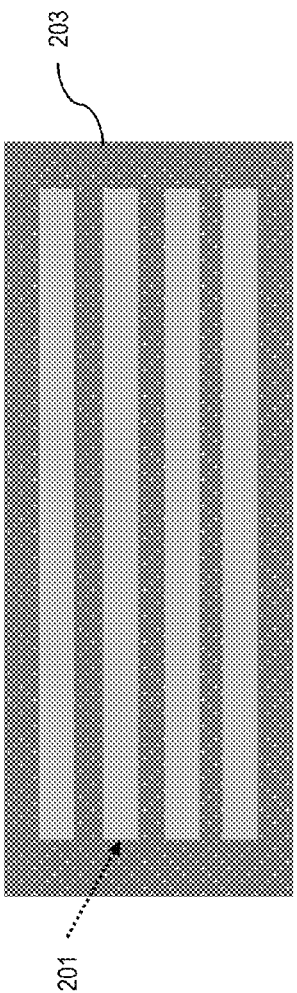
FIGS. 2A through 2Y schematically illustrate a process flow for a fin-cut process in creating self-aligned FINFET SDBs for minimum gate junction pitch and epitaxy formation, in accordance with an exemplary embodiment.
Figure 2B:
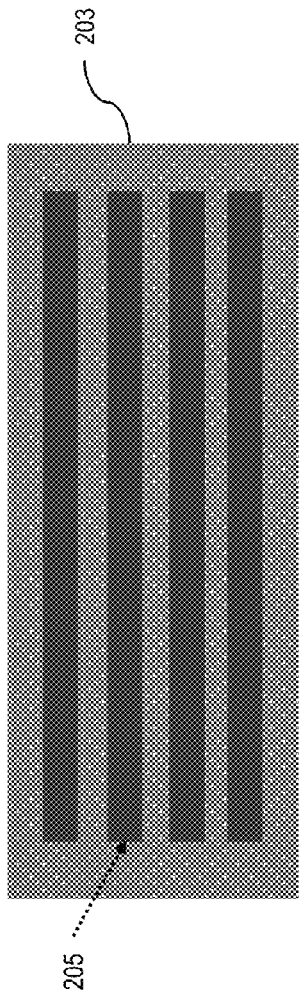
Figure 2C:
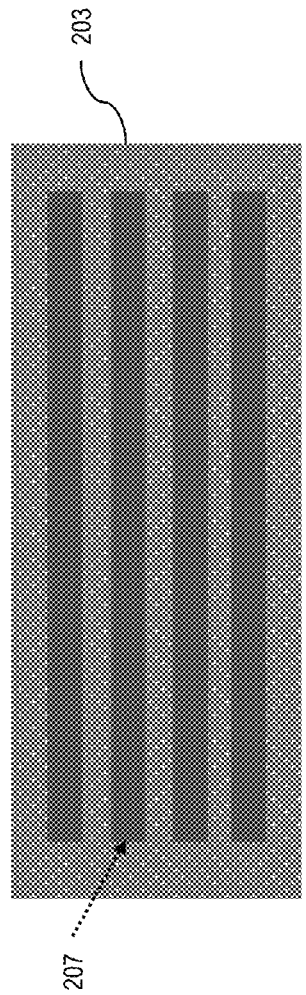
Figure 2D:
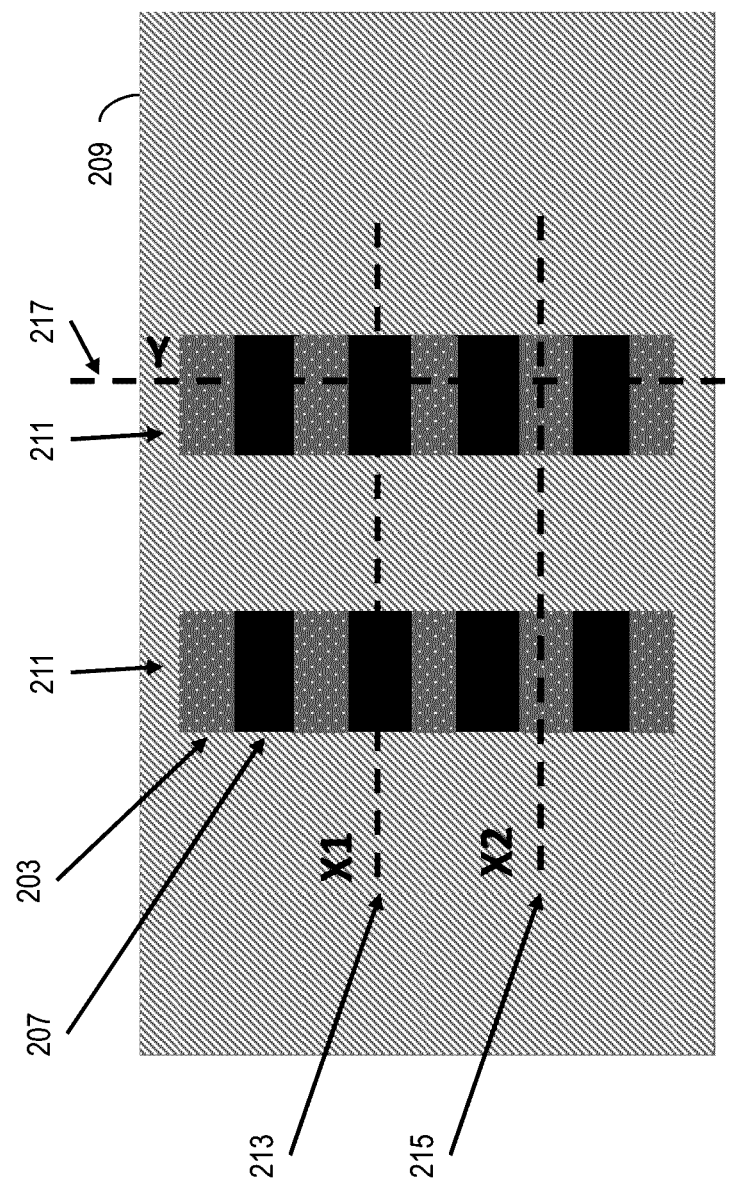
Figure 2H:
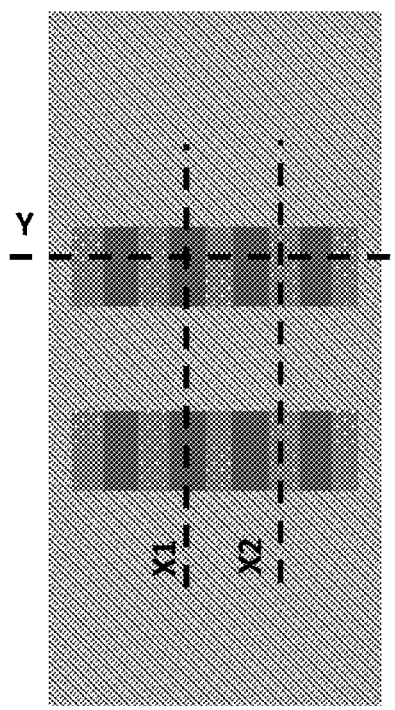
Figure 2I:
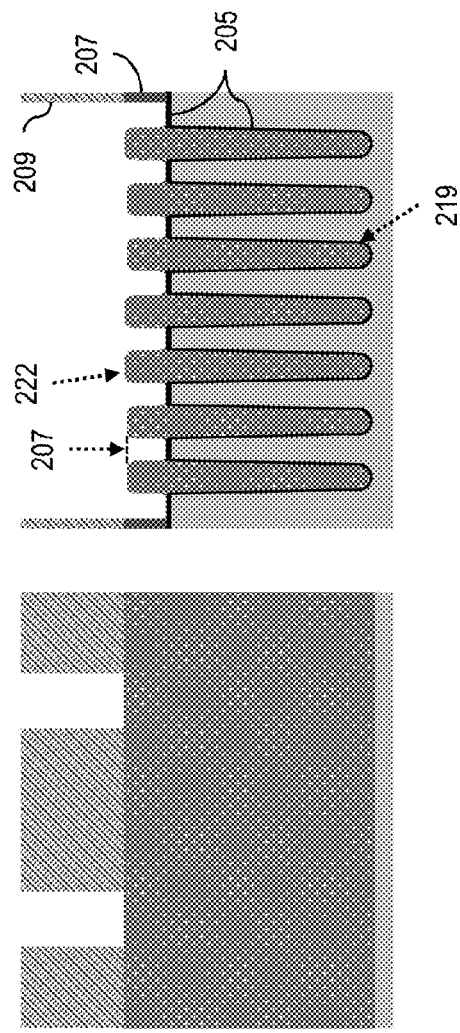
Figure 2J:
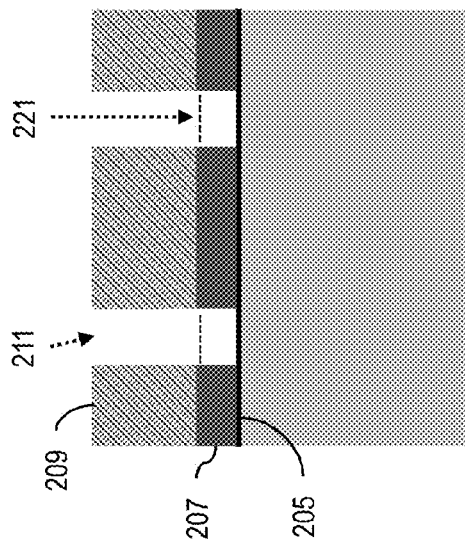
Figure 2M:
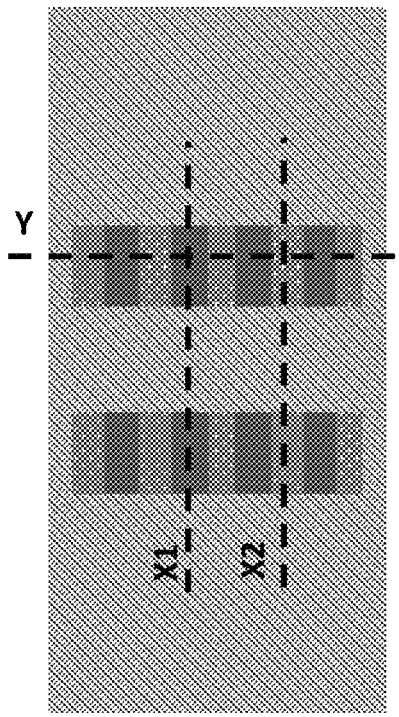
Figure 2M:
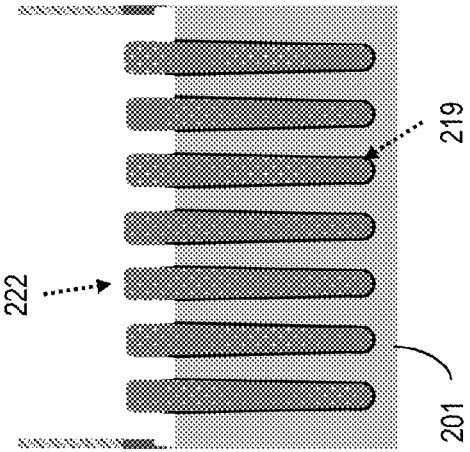
Figure 2L:
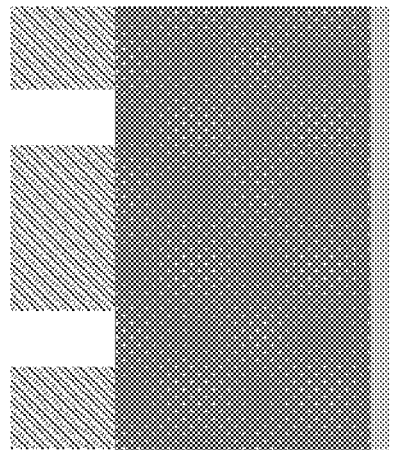
Figure 2K:
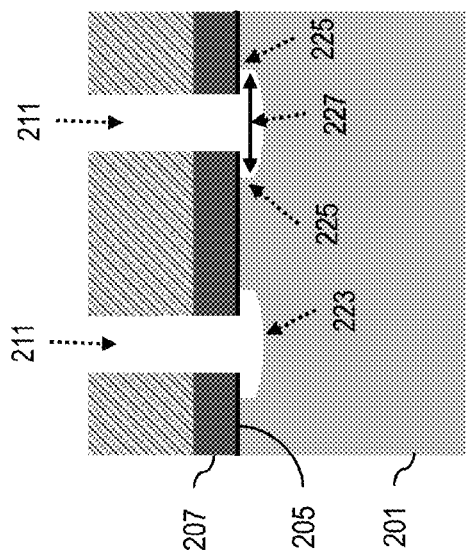
Figure 2P:
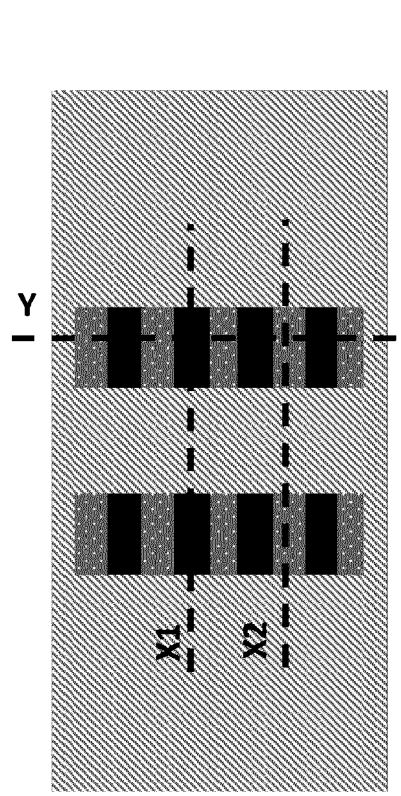
Figure 2P:
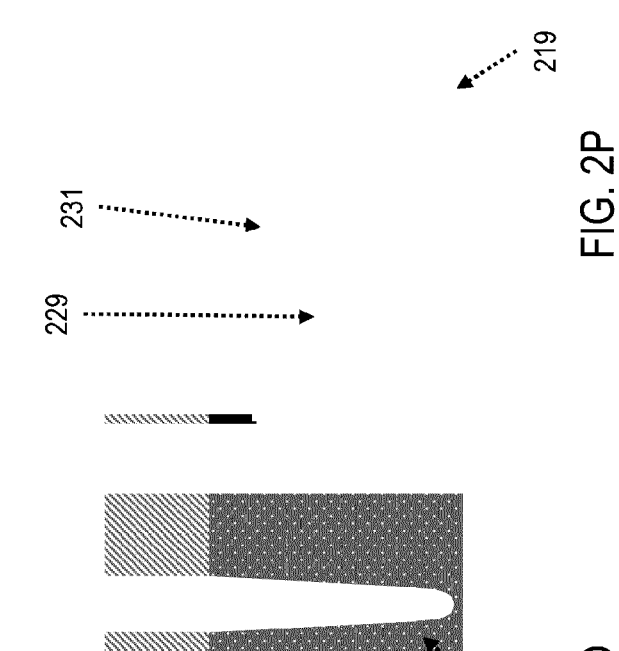
Figure 2O:
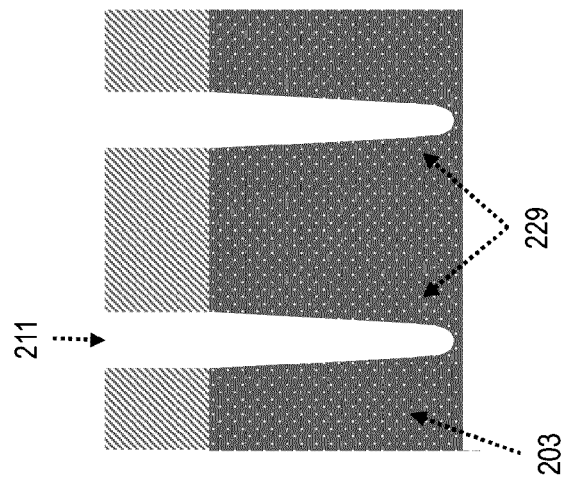
Figure 2N:
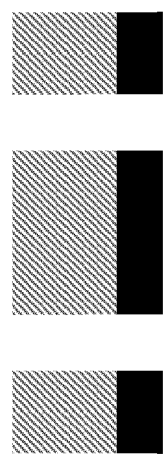
Figure 2V:
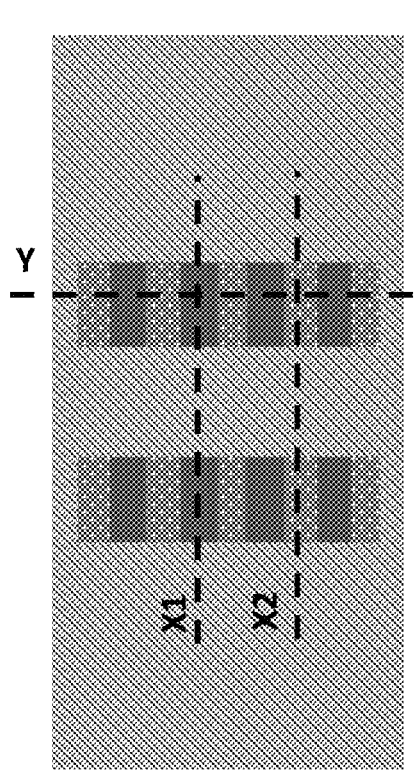
Figure 2V:
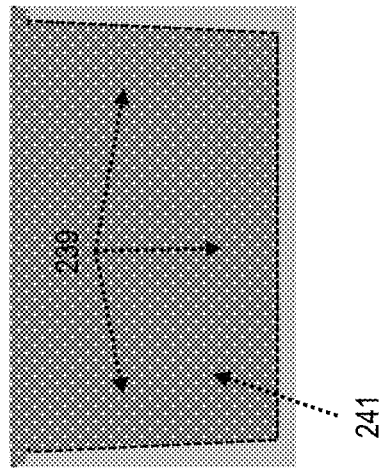
Figure 2U:
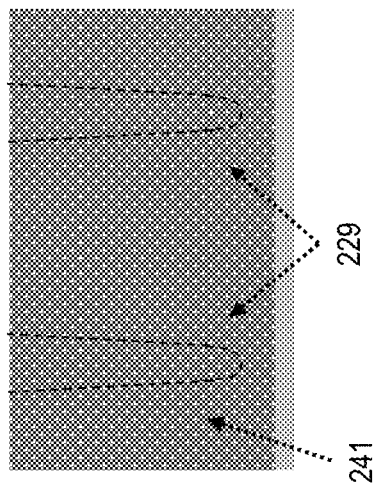
Figure 2T:
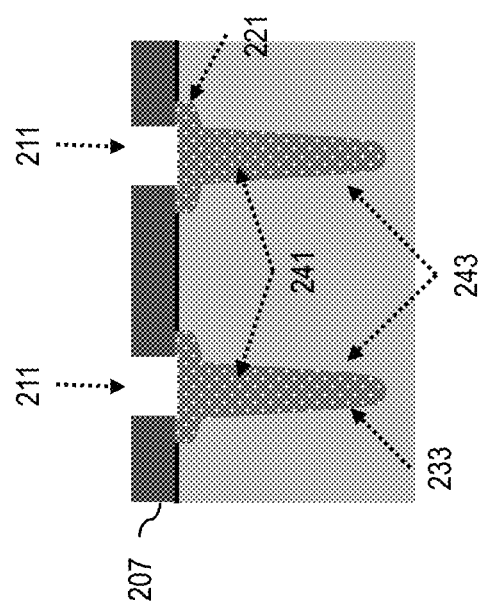
Figure 2Y:
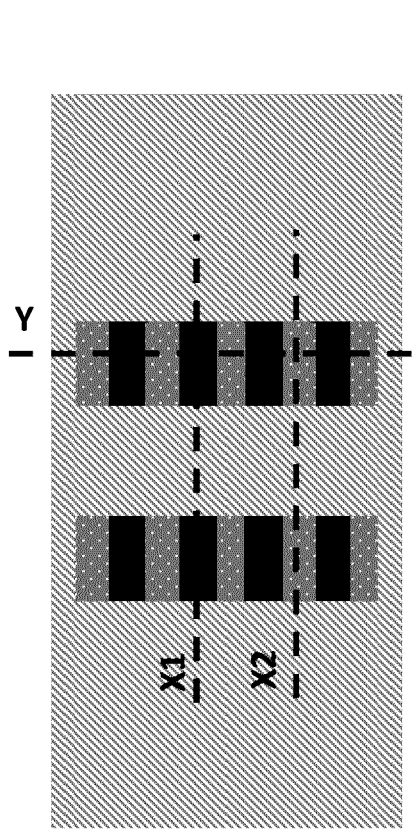
Figure 2Y:
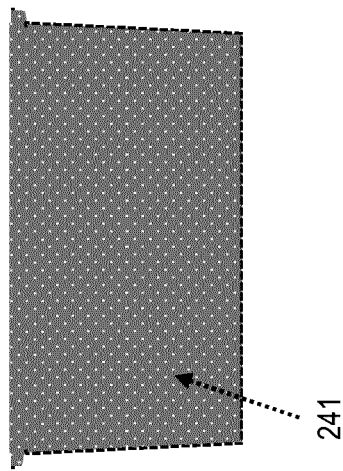

FIGS. 2A through 2Y schematically illustrate top views and cross-sectional views of a fin-cut process flow for creating FINFET self-aligned SDBs for minimum gate junction pitch and improved epitaxy formation, in accordance with an exemplary embodiment.

FIG. 2A illustrates a top view of Si fin structures 201 and oxide structure 203. In FIG. 2B, an oxide hard mask layer 205 is deposited on an upper surface of the Si fin structures 201. A hard mask layer (e.g., an amorphous carbon, an organic dielectric, a silicon nitride material, etc.) 207 is deposited on an upper surface of the oxide hard mask layer 205, as shown in FIG. 2C.

FIG. 2D illustrates a top view of a fin-cut lithography mask 209 with a pattern including openings 211 exposing segments of the oxide structure 203 and the hard mask layer 207. Cross sectional (CS) lines 213 (X1), 215 (X2), and 217 (Y) may be utilized to provide various CS views for better understanding of different material layers and processes discussed below.

FIG. 2E is a CS view along CS line X1 illustrating the Si fin structure 201, the oxide hard mask layer 205 on the upper surface of the Si fin structure 201, the hard mask layer 207 on the upper surface of the oxide hard mask layer 205, and the fin-cut mask 209 including the openings 211. FIG. 2F is a CS view along CS line X2 illustrating a portion of the Si fin structure 201, the oxide structure 203, and the fin-cut mask 209 including the openings 211. FIG. 2G is a CS view along CS line Y illustrating the Si fin structure 201, segments of the oxide hard mask layer 205, segments of the hard mask layer 207, outer edges of the fin-cut mask 209, and oxide regions 219 (e.g., portions of the oxide structure 203) including a lining of the oxide hard mask layer 205.

FIG. 2H is a CS view along CS line X1, where the fin-cut lithography mask 209 may be utilized to remove (e.g., etch away) some sections 221 from the hard mask layer 207 through openings 211 and expose the upper surface of the oxide hard mask layer 205 in the openings 211. There are no changes shown in a CS view along the CS line X2 as illustrated in FIG. 2I. A CS view along the CS line Y in FIG. 2J illustrates the removal of sections 221 from the hard mask layer 207, where tips 222 of the oxide regions 219 remain above horizontal level of the oxide hard mask layer 205.

Adverting to FIG. 2K, in a CS view along the CS line X1, exposed sections of the oxide hard mask layer 205, through the openings 211, may be removed and cavities 223 in the Si fin structure 201 may be formed, wherein each of the cavities has a concave shape (e.g., dish shape) and a width 227 that extends under the oxide hard mask layer 205 on each side 225 of the cavity 223. The cavities 223 may be formed by use of a dry or wet isotropic etching process for creating the concave shape of the cavities. There are no changes in a CS view along the CS line X2 as illustrated in FIG. 2L. A CS view along the CS line Y in FIG. 2M illustrates changes corresponding to the formation of the cavities 223 as illustrated in FIG. 2K, where horizontal sections of the oxide hard mask layer 205 and the Si fin structure 201 adjacent to the tips 222 of the oxide regions 219 are removed.

There are no changes in a CS view along the CS line X1 as illustrated in FIG. 2N. In a CS view along the CS line X2, as illustrated in FIG. 2O, an oxide etching process may be used to form trenches 229, through the openings 211, in the oxide structure 203. Adverting to FIG. 2P, a CS view along the CS line Y illustrates silicon portions 231 of the Si fin structure 201 and trenches 229, which were oxide regions 219 in the oxide structure 203.

As illustrated in a CS view along the CS line X1 in FIG. 2Q, trenches 233 are formed in the Si fin structure 201 through the openings 211 and the cavities 221, wherein each of the trenches 233 has an upper width 235 that is substantially equal to a width of an opening 211 and less than the width 227 of a cavity 221. The trenches 233 may be formed by an anisotropic etching process and may be formed to have a tapered shape, where the upper width 235 of the trench 233 is greater than its lower width 237. There are no changes in a CS view along the CS line X2 as illustrated in FIG. 2R. A CS view along the CS line Y in FIG. 2S illustrates space 239 between outer and lower boundaries of the Si fin structure 201 without the Si portions 231.

Adverting to FIG. 2T, in a CS view along the CS line X1, the fin-cut lithography mask 209 is removed and an upper surface of the hard mask 207 is exposed. Through the openings 211 in the hard mask layer 207, oxide material 241 is deposited into the trenches 233 and the cavities 221, forming STI regions 243. CS views along the CS lines X2 and Y in FIGS. 2U and 2V, respectively, illustrate the oxide material 241 filling previous trenches 229 formed in FIG. 2O and previous space 239 formed in FIG. 2S.

Figure 2X:
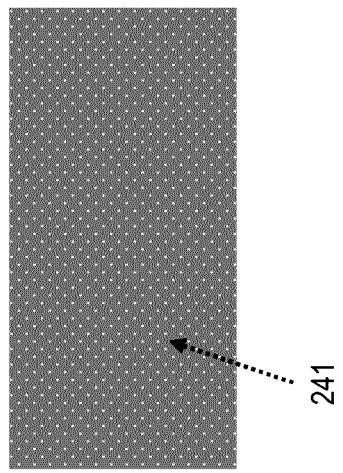
Figure 2W:
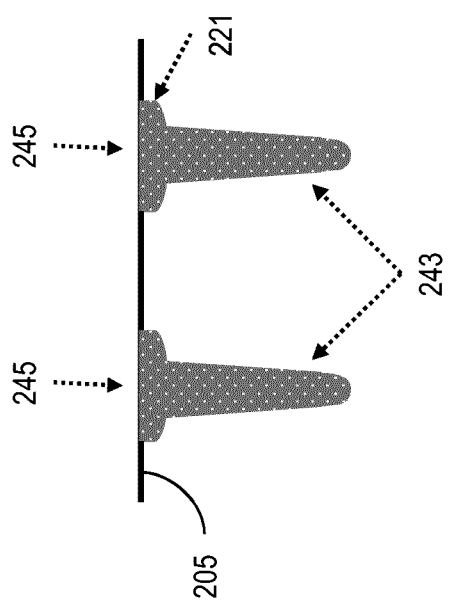

FIG. 2W presents a CS view along the CS line X1, wherein the hard mask layer 207 is removed, e.g. by CMP, down to the upper surface of the oxide hard mask layer 205 and the upper surface 245 of the filled cavities 221 of the STI regions 243. CS views along the CS lines X2 and Y in FIGS. 2X and 2Y, respectively, illustrate no changes from FIGS. 2U and 2V, respectively.

FIGS. 3A through 3K schematically illustrate a process flow for a reverse fin-cut process in creating self-aligned FINFET SDBs for minimum gate junction pitch and epitaxy formation, in accordance with an exemplary embodiment.

Figure 3A:
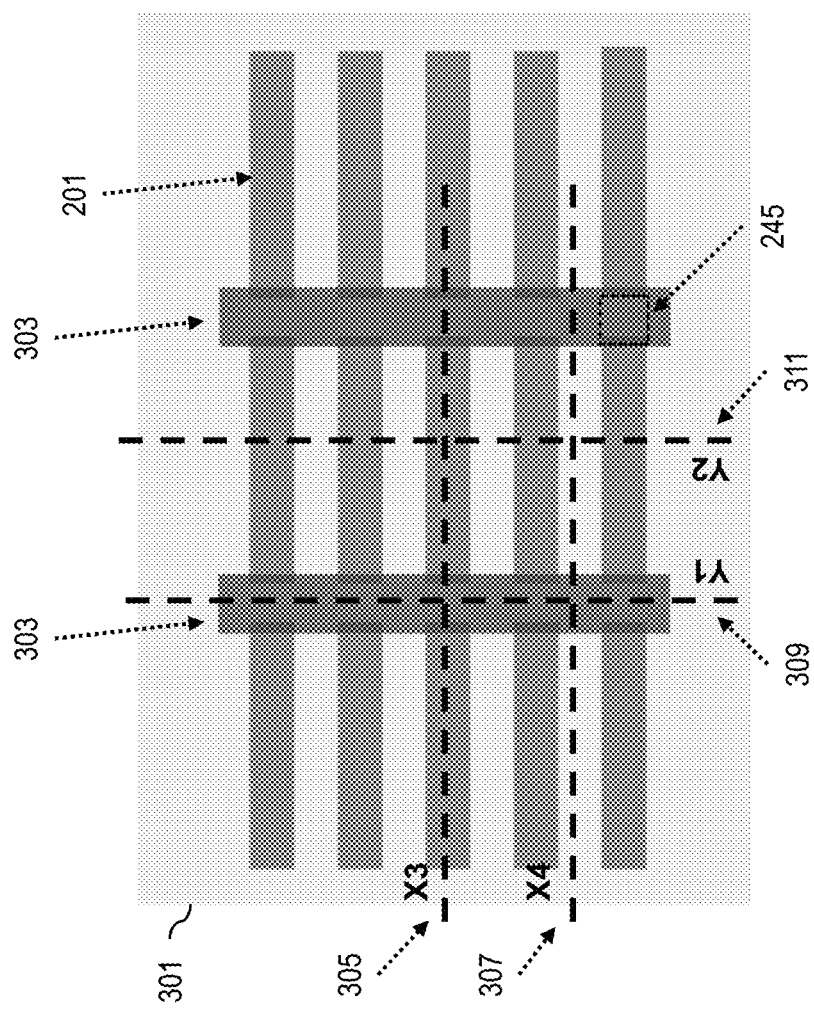

FIG. 3A illustrates a reverse fin-cut lithography mask 301 with a pattern including mask segments 303 over the upper surface 245 of the STI regions 243 and slightly overlapping sections of adjacent Si fin structures 201. CS lines 305 (X3), 307 (X4), 309 (Y1), and 311 (Y2) may be utilized to provide various CS views for better understanding of different material layers and processes discussed below.

As illustrated in FIG. 3B, a CS view along CS line X3 illustrates an oxide mask layer 313 is formed on the upper surface of the oxide hard mask layer 205 and the upper surfaces 245 of the STI regions 243, e.g., upper surface of the filled cavities 221. A reverse fin-cut lithography mask 303 with openings 315 is formed over the oxide mask layer 313 to protect SDB (STI) regions 243. FIG. 3C presents a CS view along the CS line Y1 illustrating a stack including (top to bottom) the reverse fin-cut lithography mask 303, the oxide mask layer 313, the oxide material 241, and a lower portion of the Si fin structure 201. FIG. 3D presents a CS view along the CS line Y2 illustrating the Si fin structure 201, and the oxide mask layer 313 on upper surface of oxide regions 317 and the segments of the oxide hard mask layer 205.

Adverting to FIG. 3E, a CS view along the CS line X3 is illustrated where sections 319 of the oxide mask layer 313 are removed through the openings 315 of the reverse fin-cut lithography mask 303 (in FIG. 3B). Portions 321 of the oxide mask layer 313 remain on the upper surface of the oxide hard mask layer 205, and original thickness over the STI regions 243. The reverse fin-cut lithography mask 303 is then removed, as shown in FIG. 3E, as well as in a CS view along the CS line Y1 in FIG. 3F. A CS view along the CS line Y2 in FIG. 3G illustrates a thinner oxide mask layer 313 (e.g., same level as portions 321) due to the removal of the sections 319 of the oxide mask layer 313. The difference of oxide height between the level of the original oxide mask layer 313 and the remaining portions 321 will determine the active fin height (e.g., the thicker oxide is recessed down to the upper surface of the Si fin structure 201).

Figure 3J:
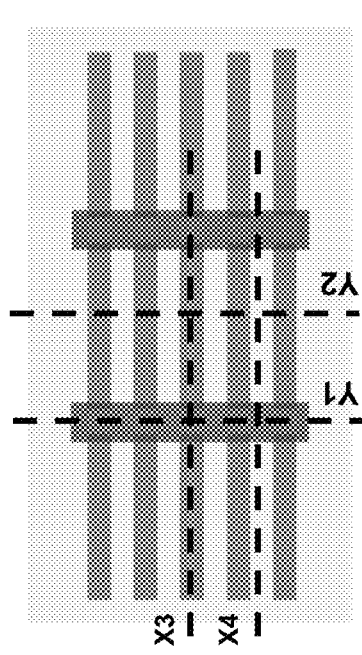
Figure 3J:
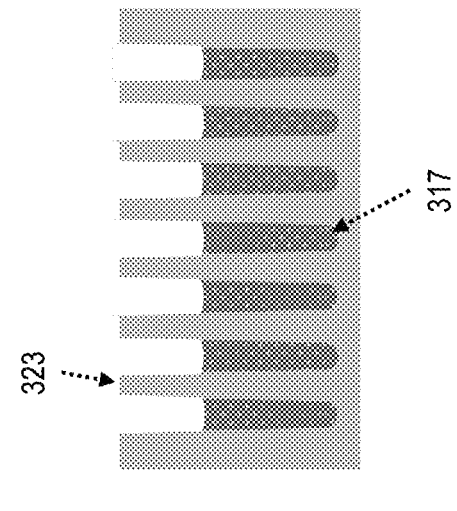
Figure 3I:
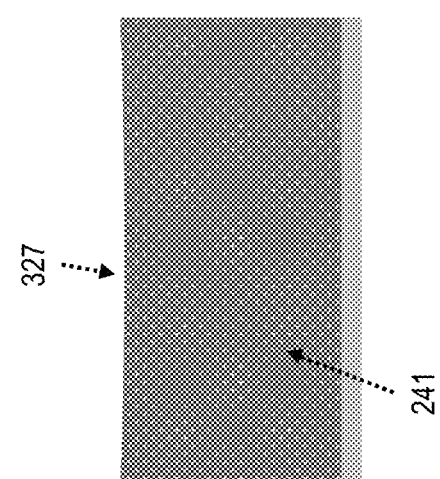
Figure 3H:
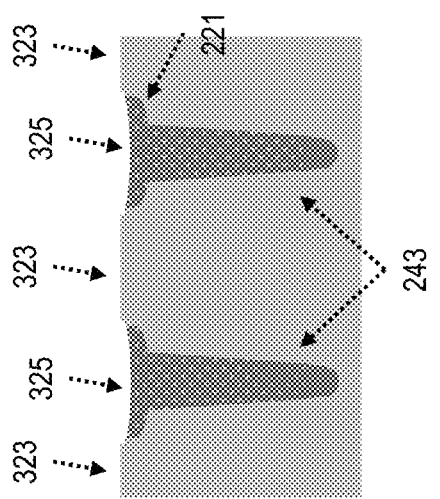

Adverting to FIG. 3H, in a CS view along the CS line X3, the remaining oxide mask layer 313 and the oxide hard mask layer 205 may be removed (e.g., by an etching process) to reveal Si fin portions 323 and upper surface of the STI regions 243. Also, a portion of the upper surface of the STI regions 243 may be removed to create a concave shaped surface 325 having a surface lower (e.g., 30 to 40 nm) than an upper surface of an adjacent Si fin portion 323. In a CS view along the CS line Y1 presented in FIG. 3I, upper surface 327 of the oxide material 241 is also concave shaped. FIG. 3J presents a CS view along the CS line Y2, where oxide mask layer 313, oxide hard mask layer 205, and oxide regions 317 are removed by a thickness equal to the original thickness of oxide mask layer 313. As a result, an upper portion of fins is revealed such that an upper surface of the Si fin portions 323 are higher than recessed upper surface of the oxide regions 317.

Figure 3K:
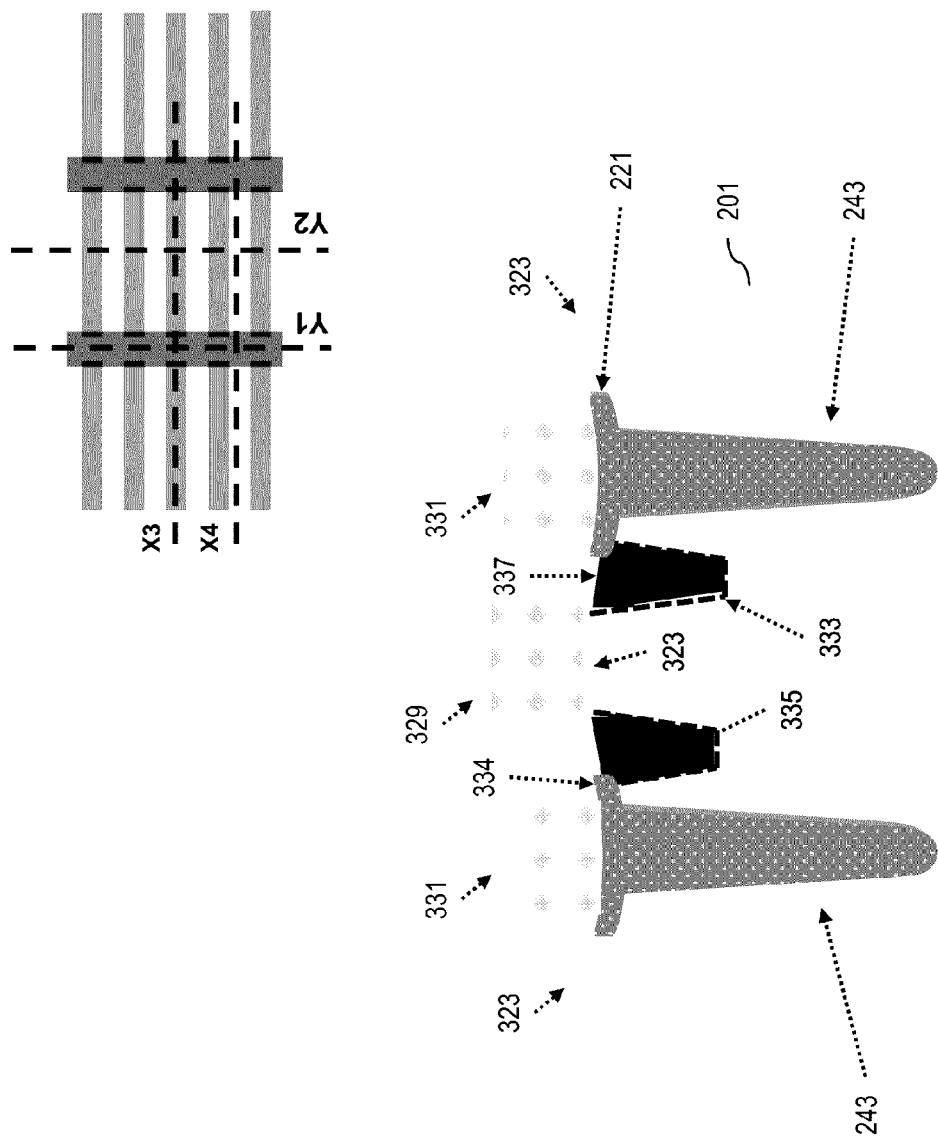

Adverting to FIG. 3K, in a CS view along the CS line X3, a gate electrode 329 is formed across (but insulated from) an upper surface of a Si fin portion 323 centered between a pair of adjacent STI regions 243. Also, dummy gate electrodes 331 are formed on the STI regions 243. S/D cavities 333 are formed in the Si fin portion 323 on opposite sides of the gate electrode 329. Due to an overhang 334 of the upper portions 221 adjacent to the cavities 333, a Si seed layer (not shown for illustrative convenience) remains on a sidewall of the cavities 333 after recessing (e.g., anisotropic etching) Si fin structure 201 adjacent to the concave shaped upper portions 221 of the STI regions 243, wherein S/D materials 335 in the cavities 333 are grown epitaxially. Upper surface 337 of the S/D material 335 adjacent to the STI regions 243 are slightly lower than the concave shaped upper portions 221 (e.g., cavities 221) of the STI regions 243. Also, the STI regions 243 extend deeper in the Si fin structure 201 than the S/D cavities 333.

The embodiments of the present disclosure can achieve several technical effects, including fin isolation with self-aligned SDB structures with minimum gate-contact pitch, better epitaxy growth after S/D recess (e.g., with Si seeds on sidewalls near the STI oxide), and good isolation between the S/D junction and gate on top of the STI region. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.), particularly for 10 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
   forming separated openings in a hard mask layer on upper surfaces of silicon (Si) fins;
   forming cavities in the Si fins through the openings, each of the cavities having a concave shape and a width extending under the hard mask layer on each side of the cavity;

forming trenches in the Si fins through the openings and the cavities, each of the trenches having an upper width equal to a width of the openings and less than the width of a cavity;
removing the hard mask layer;
filling the trenches and the cavities with an oxide layer, forming shallow trench isolation (STI) regions;
forming an oxide mask layer on the upper surface of the Si fins and upper surfaces of the STI regions;
removing upper portions of the oxide mask layer in sections between the STI regions; and
removing remaining portions of the oxide mask layer revealing the Si fins and upper surfaces of the STI regions.

2. The method according to claim 1, comprising forming the cavities by an isotropic etching process.

3. The method according to claim 1, comprising forming the trenches by an anisotropic etching process.

4. The method according to claim 1, wherein the STI regions include self-aligned and concave shaped upper portions.

5. The method according to claim 4, further comprising:
forming a pair of source/drain (S/D) regions in the Si fin in between adjacent STI regions, wherein upper surfaces of the S/D regions adjacent to the STI regions are lower than the concave shaped upper portions of the STI regions.

6. The method according to claim 5, wherein forming the S/D regions comprises:
forming a gate electrode centered between a pair of adjacent STI regions;
forming a cavity in the Si fin on opposite sides of the gate electrode;
depositing a Si seed layer on a sidewall of the cavity adjacent to the concave shaped upper portions; and
epitaxially growing S/D materials in the cavity.

7. The method according to claim 5, wherein the STI regions extend deeper than the S/D regions.

8. The method according to claim 1, comprises forming the hard mask layer of an amorphous carbon, an organic dielectric, or a silicon nitride material.

9. The method according to claim 1, comprises forming the separated openings in the hard mask through a fin-cut lithography mask.

10. The method according to claim 1, comprises removing the upper portions of the oxide mask layer through a reverse fin-cut lithography mask.

11. A method comprising:
forming separated openings in a hard mask layer on upper surfaces of silicon (Si) fins;
forming cavities in the Si fins through the openings, by an isotropic etching process, each of the cavities having a concave shape and a width extending under the hard mask layer on each side of the cavity;
forming trenches in the Si fins through the openings and the cavities, by an anisotropic etching process, each of the trenches having an upper width equal to a width of the openings and less than the width of a cavity;
removing the hard mask layer;
filling the trenches and the cavities with an oxide layer, forming shallow trench isolation (STI) regions;
forming an oxide mask layer on the upper surface of the Si fins and upper surfaces of the STI regions;
removing upper portions of the oxide mask layer in sections between the STI regions; and
removing remaining portions of the oxide mask layer revealing the Si fins and upper surfaces of the STI regions, wherein the STI regions include self-aligned and concave shaped upper portions.

12. The method according to claim 11, further comprising:
forming a pair of source/drain (S/D) regions in the Si fin in between adjacent STI regions, wherein upper surfaces of the S/D regions adjacent to the STI regions are lower than the concave shaped upper portions of the STI regions, and wherein the STI regions extend deeper than the S/D regions.

13. The method according to claim 12, wherein forming the S/D regions comprises:
forming a gate electrode centered between a pair of adjacent STI regions;
forming a cavity in the Si fin on opposite sides of the gate electrode;
depositing a Si seed layer on a sidewall of the cavity adjacent to the concave shaped upper portions; and
epitaxially growing S/D materials in the cavity.

14. The method according to claim 11, comprises forming the hard mask layer of an amorphous carbon, an organic dielectric, or a silicon nitride material.

15. The method according to claim 11, comprises forming the separated openings in the hard mask through a fin-cut lithography mask.

16. The method according to claim 11, comprises removing the upper portions of the oxide mask layer through a reverse fin-cut lithography mask.

* * * * *